United States Patent [19]
Roeschert et al.

[11] Patent Number: 5,256,517
[45] Date of Patent: Oct. 26, 1993

[54] POSITIVE-WORKING RADIATION-SENSITIVE MIXTURE AND RECORDING MATERIAL FOR EXPOSURE TO DUV RADIATION CONTAINING POLYFUNCTIONAL COMPOUND HAVING α-DIAZO-β-KETO ESTER UNITS AND SULFONATE UNITS

[75] Inventors: Horst Roeschert, Ober-Hilbersheim; Georg Pawlowski, Wiesbaden, both of Fed. Rep. of Germany; Hans-Joachim Merrem, Basking Ridge, N.J.; Ralph Dammel, Klein-Winternheim; Walter Spiess, Dieburg, both of Fed. Rep. of Germany

[73] Assignee: Hoechst Aktiengesellschaft, Frankfurt am Main, Fed. Rep. of Germany

[21] Appl. No.: 694,353

[22] Filed: May 1, 1991

[30] Foreign Application Priority Data

May 8, 1990 [DE] Fed. Rep. of Germany ....... 4014648

[51] Int. Cl.$^5$ ...................... G03F 7/022; G03F 7/023
[52] U.S. Cl. .................................... 430/165; 430/189; 430/191; 430/192; 430/193; 534/556; 534/557; 534/560; 534/561; 534/565
[58] Field of Search ............... 430/189, 191, 192, 193, 430/165; 534/556, 557, 558, 560, 561, 564, 565

[56] References Cited

U.S. PATENT DOCUMENTS

| | | | |
|---|---|---|---|
| 4,339,522 | 7/1982 | Balanson et al. | 430/192 |
| 4,622,283 | 11/1986 | Gray | 430/191 |
| 4,735,885 | 4/1988 | Hopf et al. | 430/192 |
| 4,996,301 | 2/1991 | Wilharm et al. | 534/556 |
| 5,191,069 | 3/1993 | Roeschert et al. | 534/556 |

FOREIGN PATENT DOCUMENTS

| | | |
|---|---|---|
| 0195986 | 10/1986 | European Pat. Off. . |
| 0198674 | 10/1986 | European Pat. Off. . |
| 0319325 | 6/1989 | European Pat. Off. . |
| 378067 | 7/1990 | European Pat. Off. . |
| 3841571 | 6/1989 | Fed. Rep. of Germany . |

OTHER PUBLICATIONS

Makoto Murata et al., Mechanisms of the Dissolution Inhabitation Effect and Their Application to Designing Novel Deep-UV Resists, SPIE vo. 1086, Advances in Resist Technology and Processing VI (1989).
Chemical Abstracts, vol. 111, 1989, 111:222146b-JP 01,106,034. Positive-working photoresist material for fine patterning, etc.
28-Heterocycles, vol. 99, 1983, 99:53746y Bicyclic diazodiketocyclopentanes. SU-1,004,359.
Chemical Abstracts, vol. 111, 1989, 111:123850v, Photo resin compositions for fine patterning. JP 0180,944.
Chemical Abstracts, vol. 111, 1989, 111: 15357f Positive-working photoresist., JP 63,253,938.
74-Radiation Chem., Photochem., vol. 111, 1989, 111:222148d Positive-working photoresist material for fine, etc. JP 01,106,036.
74-Radiation Chem. Photochem, vol. 111, 1989, 111:48158v Photoresist compositions, JP 01,10,237.
Proceedings of SPIE-vol. 771, "Advances in Resist Technology and Processing IV." Mar. 2-3, 1987. Murrae J. Bowden.
H. Sugiyama, K. Ebata, A. Mizushima and K. Nate, "Positive Excimer Resist Prepared with Aliphatic Diazoketones" in SPIE, 920. pp. 51-61, 1988.
Patent Abstracts of Japan, vol. 13, No. 478 (P-951) (3826) Oct. 30, 1989, & JP-A-01 188852, Jul. 28, 1989.

Primary Examiner—Charles L. Bowers, Jr.
Assistant Examiner—Christopher G. Young
Attorney, Agent, or Firm—Foley & Lardner

[57] ABSTRACT

A positive-working radiation-sensitive mixture is described which essentially contains a photoactive component and a water-insoluble binder which is soluble, or at least swellable, in aqueous alkaline solution, wherein a compound is used, as photoactive component, which contains α-diazo-β-keto ester units and sulfonate units of the formula I (Abstract continued on next page.)

ABSTRACT

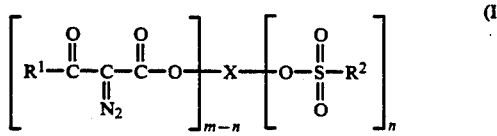 (I)

in which

R$^1$ and R$^2$, independently of one another, are an unsubstituted or substituted aliphatic, cycloaliphatic, araliphatic or aromatic radical having 4 to 20 carbon atoms, it being possible for individual CH$_2$ groups to be replaced by oxygen or sulfur atoms or by N or NH groups and/or contain keto groups, X is an unsubstituted or substituted aliphatic, cycloaliphatic, carbocyclic, heterocyclic or araliphatic radical having 2 to 22 carbon atoms, it being possible for individual CH$_2$ groups to be replaced by oxygen or sulfur atoms or by the groups —NR$^3$—, —C(O)—O—, —C(O)—NR$^3$—,

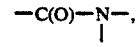

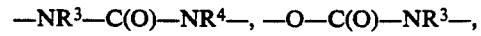

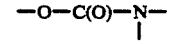

or —O—C(O)—O—, or CH groups to be replaced by

in which

R$^3$ and R$^4$, independently of one another, are hydrogen or an unsubstituted or substituted aliphatic, carbocyclic or araliphatic radical, m is an integer from 3 to 8, n is an integer from 1 to 3, and m>n.

The radiation-sensitive mixture is especially suitable for exposure to radiation having a wavelength of about 190 to 300 nm.

59 Claims, No Drawings

POSITIVE-WORKING RADIATION-SENSITIVE MIXTURE AND RECORDING MATERIAL FOR EXPOSURE TO DUV RADIATION CONTAINING POLYFUNCTIONAL COMPOUND HAVING α-DIAZO-β-KETO ESTER UNITS AND SULFONATE UNITS

The invention relates to a positive-working radiation-sensitive mixture containing a photoactive component and a water-insoluble binder which is soluble, or at least swellable, in aqueous alkaline solution.

Radiation-sensitive mixtures containing photoactive diazo derivatives which are suitable for irradiation with high-energy UV radiation have been described in the literature for some time.

U.S. Pat. No. 4,339,522 discloses positive-working radiation-sensitive mixtures which contain, as a photoactive compound, a diazo derivative of Meldrum's acid. This compound is said to be suitable for exposure to high-energy UV radiation in the range between 200 and 300 nm. On the use of these mixtures, however, it became apparent that the photoactive compound is exuded under the elevated processing temperatures frequently employed in practice; the radiation-sensitive mixture loses its original activity, so that reproducible structuring is not possible.

EP-A 0 198 674 and 0 262 864, JP-A 01/106 034, U.S. Pat. No. 4,622,283 and SU-A 1 004 359 provide 2-diazocyclohexane-1,3-dione or -cyclopentane-1,3-dione derivatives as photoactive compounds for radiation-sensitive mixtures of the type described. These compounds have lower volatility, but this is balanced by the fact that they exhibit, depending on i0 the substitution pattern present, poor compatibility in the radiation-sensitive mixture. This becomes apparent, in particular, on drying of the coatings by the photoactive compound crystallizing out, by their insolubility in solvents which are suitable in practice or by coating inhomogeneity caused by phase separation.

Further positive-working photoactive compounds which are sensitive in the deep UV region are disclosed in EP-A 0 129 694 and U.S. Pat. No. 4,735,885. The compounds described in these documents have the disadvantage that the carbenes formed from these on exposure do not have adequate stability in the matrix for the desired formation of carboxylic acid. This results in an inadequate solubility difference between the exposed and unexposed areas in the developer and thus in an undesirably high removal rate of the unexposed areas. A possible explanation for this phenomenon is given by C. G. Willson et al. in SPIE, Vol. 771, "Advances in Resist Technology and Processing IV", 2 (1987).

EP-A 0 195 986 therefore proposes α-phosphoryl-substituted diazocarbonyl compounds as photoactive compounds, since these have a higher carbene stability. In practice, however, such compounds will probably not be widely used since atoms of potential use for doping, such as, for example, the phosphorus present in these compounds, must be excluded with extreme care in the processing operations.

H. Sugiyama, K. Ebata, A. Mizushima and K. Nate in their paper "Positive Excimer Laser Resist Prepared with Aliphatic Diazoketones" [SPIE Proc., 920,51 (1988)], present novel α-diazoacetoacetates which are employed as photoactive compounds in positive-working radiation-sensitive mixtures, in particular on use of radiation in the deep UV range. Since these are derivatives of aceto-acetic acid, the keto group in the β-position to the ester group is directly adjacent to a terminal methyl group.

Diazo derivatives of acetoacetic acid are also employed in EP-A 0 319 325 and DE-A 38 41 571 as radiation-sensitive components in the deep UV range (<300 nm). Radiation-sensitive mixtures which contain the said compounds as photoactive components have good bleaching properties, but their properties with respect to image differentiation are poor.

Aliphatic bis(carbonyl)diazomethanes, which are used in 10 JP-A 01/080 944, have inadequate thermal stability, which is why such compounds are hardly used at all in practice. For bis(carbonyl)diazomethanes, which are claimed in JP-A 63/253 938, 01/106 036 and 01/010 237, the same applies as for the derivatives of acetoacetic acid.

SUMMARY OF THE INVENTION

Accordingly, it is an object of the present invention to provide a positive-working radiation-sensitive mixture which avoids the numerous disadvantages described above.

Another object of the present invention is to provide a positive-working radiation-sensitive mixture comprising a photoactive compound which has high sensitivity in the deep UV and allows good differentiation between the exposed and unexposed areas of the coating.

A further object of the present invention is to provide a mixture comprising a photoactive compound which is readily compatible with a wide range of polymers used in practice, does not exude from the radiation-sensitive mixture, and has high thermal stability and practical photosensitivity.

Yet another object of the present invention is to provide a positive-working radiation-sensitive recording material comprising the foregoing mixture.

Still another object of the present invention is to provide a method for producing the foregoing recording material.

In accomplishing the foregoing objectives, there has been provided, in accordance with one aspect of the present invention, a positive-working radiation-sensitive mixture comprising (a) a binder which is insoluble in water and soluble or at least swellable in aqueous alkaline solution, and (b) a photoactive component which comprises a polyfunctional compound comprising α-diazo-β-keto ester units and sulfonate units according to the formula I

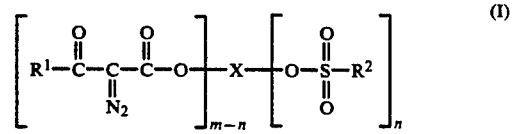

in which
R$^1$ and R$^2$, independently of one another, are an unsubstituted or substituted aliphatic, cycloaliphatic, araliphatic or aromatic radical having 4 to 20 carbon atoms, it being possible for individual CH$_2$ groups to be replaced by oxygen or sulfur atoms or by N or NH groups and/or to contain keto groups,
X is an unsubstituted or substituted aliphatic, cycloaliphatic, carbocyclic, heterocyclic or araliphatic radical having 2 to 22 carbon atoms, it being possible for individual CH$_2$ groups to be replaced by oxygen or sulfur atoms or by the groups —NR$^3$—, —C(O)—O—, —C(O)—NR$^3$—,

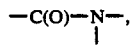

—NR$^3$—C(O)—NR$^4$—, —O—C(O)—NR$^3$—,

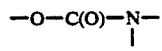

or —O—C(O)—O—, or CH groups to be replaced by

in which

R$^3$ and R$^4$, independently of one another, are hydrogen or an unsubstituted or substituted aliphatic, carbocyclic or araliphatic radical, m is an integer from 3 to 8, n is an integer from 1 to 3, and m>n.

In accordance with another aspect of the present invention there is provided a positive-working recording material comprising a base and, applied thereto, a positive-working mixture as described above.

In accordance with a further aspect of the present invention there is provided a process for producing a positive-working recording material which comprises the steps of providing a base, coating the base with a radiation-sensitive mixture by spraying-on, rolling, knife-application, casting, flow coating, spin coating or immersion coating or by means of a wide-slot die, wherein the radiation-sensitive mixture comprises a solvent and a mixture as described above, and removing the solvent by evaporation so that a coating thickness of about 0.1 to 100 μm is produced.

Other objects, features and advantages of the present invention will become apparent to those skilled in the art from the following detailed description. It is to be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

In a preferred embodiment, R$^3$ and R$^4$ are hydrogen, (C$_1$-C$_3$)alkyl, (C$_6$-C$_{12}$)aryl or (C$_6$-C$_{11}$)aralkyl, it likewise being possible for the radicals (in particular aryl or aralkyl) to be substituted on the ring by (C$_1$-C$_3$)alkyl, (C$_1$-C$_3$)alkoxy, halogen, in particular chlorine or bromine, or amino, in particular a primary or secondary amine. R$^3$ and R$^4$ are particularly preferably hydrogen or (C$_1$-C$_3$)alkyl, but in particular hydrogen.

The radicals R$^1$, R$^2$ and X may, if desired, be substituted, in particular by (C$_1$-C$_3$)alkyl, (C$_1$-C$_3$)alkoxy, halogen, in particular chlorine or bromine, nitrile, amino or nitro. Preferred radicals R$^1$, R$^2$ and X are those which are substituted by (C$_1$-C$_3$)alkyl or (C$_1$-C$_3$)alkoxy. In particular when R$^1$ and X are alkyl or alkylene, the unsubstituted derivatives are preferred. If R$^2$ is alkyl, by contrast, the substituted derivatives are preferred.

The aliphatic radicals R: may be straight-chain or branched. The number of chain members here is preferably from 4 to 10, in particular from 4 to 8. These include the particularly preferred pure carbon chains and the substituted chains in which CH$_2$ groups are replaced by oxygen atoms or —NH— groups and/or keto groups are present, which are also taken to mean ether, keto, ester, amido or amido groups, i.e. also esters of carbamic acid. Of the substituted aliphatic radicals R$^1$ those are particularly preferred in which methylene groups, especially 2 methylene groups, are replaced by oxygen atoms and which do not contain further substituents. If R$^1$ is a pure, in particular straight-chain, carbon chain, there is no necessity to limit the number of carbons; it is entirely possible for aliphatic radicals having up to 20 carbon atoms to be used. Nevertheless, the t-butyl radical is particularly preferred.

If R$^1$ is a cycloaliphatic radical, the number of ring members is preferably 4, 5, 6 or 12, in particularly 4, 5 or 6. The unsubstituted variants are particularly preferred. Examples are the cyclobutyl, cyclopentyl and cyclohexyl radicals. The cyclohexyl radical is particularly preferred.

If R$^1$ is an araliphatic radical, the number of members of the aliphatic moiety of the radical is from 2 to 11, in particular from 2 to 5. If the aliphatic part is a pure carbon chain, the number of carbon atoms is preferably 1 or 2. If CH$_2$ groups are replaced by oxygen atoms, these may occur as bridging members between aromatic and aliphatic moieties of the radical R$^1$, but also in the aliphatic moiety itself. In both cases, it is particularly preferred for the total remaining number of carbon atoms as chain members in the aliphatic moiety of this radical to be 1 or 2, the ether oxygen atom in the case of 2 carbon atoms as chain members being arranged in such a manner that it is directly adjacent to the two CH$_2$ groups. Specific examples of araliphatic radicals are the benzyl, phenoxymethyl and benzyloxymethyl radicals. If, in addition, further CH$_2$ groups in the aliphatic moiety of the araliphatic radical R$^1$ are replaced by heteroatoms and/or this moiety is substituted, the total number of chain members of the aliphatic moiety is from 3 to 5. This includes, inter alia, phenyl or benzyl radicals bonded via ester groups, but also benzyl or phenyl esters of carbamic acid. However, the aliphatic moiety may also be the amido group of an aromatic dicarboxylic acid. The aromatic moiety of a radical of this type comprises, in particular, 6 carbon atoms. If the aromatic moiety of the araliphatic radical is bonded directly adjacent to the keto group, i.e. as an arylene radical, there are no limitations for the aliphatic moiety present therein with respect to the minimum number of carbon atoms present.

The aromatic radicals R$^1$ preferably contain no hetero atoms, such as, for example, oxygen in the ring system. If R$^1$ is an aromatic radical, it preferably contains 6 to 12 carbon atoms, in particular 6 carbon atoms, i.e. it is a phenyl radical. However, aromatic radicals R$^1$ are generally not preferred.

Overall, particularly preferred radicals R$^1$ are t-butyl, n-hexyl, nonyl, octadecyl, 2,5-dioxahexyl, cyclopentyl, cyclohexyl, benzyl, phenoxymethyl and benzyloxymethyl. The t-butyl, phenoxymethyl and cyclohexyl radicals are especially preferred.

The aliphatic radicals $R^2$ may be straight-chain or branched. The number of chain members here is preferably from 1 to 8, in particular from 2 to 6. These include both pure carbon chains and substituted chains in which $CH_2$ groups have been replaced by oxygen atoms or —NH— groups and/or contain keto groups, including ether, keto, ester, amido or imido groups. In the pure aliphatic radicals $R^2$, branched carbon chains are preferred. There is no necessity to limit the number of carbon atoms; it is entirely possible for aliphatic radicals having more than 8 carbon atoms to occur. Nevertheless, the i-propyl and the t-butyl radicals are preferred.

If $R^2$ is a cycloaliphatic radical, the number of ring members is preferably 4, 5, 6 or 12, in particular 5 or 6. The unsubstituted variants are preferred. However, cycloaliphatic radicals $R^2$ are overall not preferred.

If $R^2$ is an araliphatic radical, the number of members of the aliphatic moiety is from 2 to 11, in particular from 2 to 5. If the araliphatic radical is a pure carbon chain, the number of carbon atoms is preferably 1. If $CH_2$ groups are replaced by oxygen atoms, they may occur as bridging members between the aromatic and aliphatic moieties of the radical $R^2$, but also in the aliphatic moiety. In both cases, it is particularly preferred for the total remaining number of carbon atoms as chain members in the aliphatic moiety of this radical to be 1 or 2. The aromatic moiety of the araliphatic radical $R^2$ comprises in particular 6 carbon atoms.

The aromatic radicals $R^2$ may contain heteroatoms, such as sulfur or oxygen, in their ring system. These are preferably substituted. If $R^2$ is an aromatic radical, it preferably contains 6 to 12 carbon atoms, in particular 6 carbon atoms, i.e. it is a phenyl radical. Aromatic radicals $R^2$ are particularly preferred. If the aromatic radicals $R^2$ are substituted, they are preferably alkyl, alkoxy, halogen, nitrile or nitro groups. However, amino and amido groups are also possible as substituents. There are no limitations with respect to the number of substituents and the substitution pattern.

Overall, particularly preferred radicals $R^2$ are lower alkyl radicals ($C_1$-$C_4$), such as i-propyl and t-butyl, which may, if desired, be substituted by halogen atoms, and aromatic compounds. Phenyl radicals which are substituted in the 4-position by methyl, t-butyl, trifluoromethyl, bromine or cyano groups are especially preferred.

X is an aliphatic or cycloaliphatic radical, which may be saturated or unsaturated, or a carbocyclic, heterocyclic or araliphatic radical having 2 to 22 carbon atoms, in particular having 2 to 17 carbon atoms. In these radicals, in addition, at least one $CH_2$ group may be replaced by heteroatoms, such as oxygen, sulfur or by groups such as —$NR^3$—, —C(O)—O—, —C(O)—$NR^3$—,

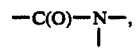

—$NR^3$—, C(O)—$NR^4$, —O—C(O)—$NR^3$—,

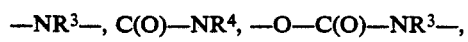

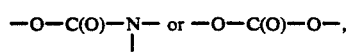

or CH groups may be replaced by —N—. Particularly preferred aliphatic or araliphatic radicals are those variants in which a maximum of two $CH_2$ groups have been replaced by one type of the abovementioned groups. If $CH_2$ groups are replaced by heteroatoms, the maximum number of these can preferably be 5, in particular 3. It is particularly preferred if all the $CH_2$ groups to be replaced are replaced by heteroatoms of one type.

An unsubstituted, saturated or unsaturated aliphatic radical X contains, in the preferred variant, a maximum of 6 carbon atoms. Unsaturated aliphatic radicals X include, in particular, those whose $CH_2$ or CH groups are not replaced by heteroatoms or the abovementioned groups. In their particular embodiment, they contain a maximum of one C—C multiple bond; the number of chain members in a radical of this type is particularly preferably 4. The said radicals X are preferably trivalent.

If $CH_2$ groups in the aliphatic radicals X are replaced by heteroatoms, these are preferably surrounded by alkylene radicals having at least two $CH_2$ groups each. If sulfur is the heteroatom in the aliphatic radical X, it particularly preferably occurs only once per radical. It is, in particular, surrounded by alkyl radicals having a maximum of three $CH_2$ groups each. If oxygen is employed as the heteroatom in the aliphatic radical, it can occur more frequently per radical, in particular 2 to 4 times. In this case, the alkylene radicals containing two oxygen atoms contain at least three $CH_2$ groups.

If the number of carbon atoms in the unsubstituted aliphatic radical is greater than 3, this alkylene radical is, in particular, in the form of a branched isomer. The t-butyl and t-pentyl radicals are particularly preferred.

The radical X may also contain a plurality of alkyl radicals, in particular t-butyl or t-pentyl radicals, bonded via heteroatoms or the abovementioned groups replacing $CH_2$ groups. This is particularly preferred if these radicals are more than divalent.

If the t-butyl or t-pentyl radical is trivalent, m is at least 3. Preferably, m=4 is achieved by a divalent t-pentyl or t-butyl radical occurring twice in the radical X. Also, m=4 is achieved by a divalent propyl radical occurring twice in the radical X.

Preferably, m=6 is achieved by two trivalent radicals (t-butyl or t-pentyl) or three divalent propyl radicals occurring in the radical X. Also, m=8 is achieved, for example, by the combination of 4 divalent radicals or 2 trivalent radicals with one divalent radical.

The valency of the radical X in excess of two can also be achieved by the presence of heteroatoms which are more than divalent: if one CH group in the aliphatic radical X is replaced by

m values of 3 can be achieved. If two CH groups are replaced by

m can achieve a maximum of 4.

In all cases in which CH groups in the radical X are replaced by

it is preferred that no substitution of a CH$_2$ group by a further heteroatom or by one of the above-described groups takes place. The number of CH$_2$ groups between the nitrogen heteroatom and the radical of the formula I bonded to the radical X is at least 2, in particular 2.

Pure, i.e. unsubstituted, cycloaliphatic radicals are not preferred as variants of the radical X. A specific example of a cycloaliphatic radical is, in particular, the cyclohexyl radical. However, it may be substituted, in particular by hydroxyl and/or alkyl or alkylene, the valency thereof preferably being determined by the number of alkylene substituents on the cycloaliphatic radical. Very particular preference is given to a cyclohexyl radical which carries four methylene groups as substituents, which ensure the bonding of the α-diazo-β-keto ester units and sulfonate units as in the formula I (m=5).

The cycloaliphatic radicals as variants of the radical X are usually more a combination of a cycloaliphatic moiety and a chain-like aliphatic moiety. In this case, the cycloaliphatic moiety is preferably not substituted by replacing CH$_2$ groups from this moiety with heteroatoms or groups from the abovementioned series.

An exception is a six-membered ring (heterocyclic ring) comprising three carboxamide units in which the coupling of the α-diazo-β-keto ester units and the sulfonate units of the formula I takes place via ethylene groups on the amido nitrogen. Therefore m is 3 and n is 1.

However, if X is a combination of a pure cycloaliphatic moiety and one or more chain-like aliphatic moieties having 2 or more carbon atoms, the cycloaliphatic moiety is, in particular, directly adjacent to a CH$_2$ group which has been replaced by one of the abovementioned heteroatoms or groups. A particularly preferred variant is that in which the cycloaliphatic moiety is directly adjacent to a nitrogen atom, in particular the groups

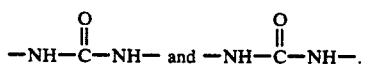

In this case, the preferred cycloaliphatic moiety is a cyclohexyl radical, which may be monovalent or divalent, the latter preferably in the 1,4-position.

In both cases, the linking of one of the free valencies of the radicals

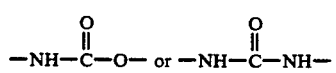

to α-diazo-β-keto ester units and sulfonate units in accordance with the formula I takes place via an alkylene radical having at least two CH$_2$ units. If an

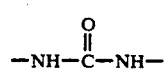

radical, the linking group is preferably a t-butylene radical. If a

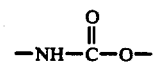

radical, i.e. the discussed linking takes place via the oxygen atom of this group, the linking group employed is preferably an ethylene radical.

If the variant of the group X is an araliphatic radical, the aromatic moiety, in particular a phenyl or, if divalent, a phenylene radical, may be bonded either via a nitrogen atom or via an oxygen atom. However, the nitrogen atom is again preferred here—if the two atoms are available for selection. An example in which the aromatic moiety is bonded directly via an oxygen atom is an ether oxygen atom bonded to the α-diazo-β-keto ester unit and/or sulfonate unit via an ethylene group. As a third variant, it is also possible in this case for the aromatic radical, in particular if it is monovalent, to be bonded via the keto group of a

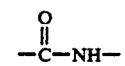

radical. In this case, the nitrogen atom carries, in particular, an ethylene radical.

If an araliphatic radical X is present, the aliphatic moiety of the radical X which is bonded via the nitrogen atom of a radical

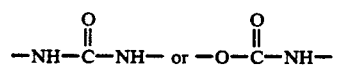

replacing a CH$_2$ group is, in particular, a t-butylene or ethylene radical; if the aliphatic moiety is bonded via the oxygen atom, it is particularly preferably an ethylene radical.

The preference for an ethylene group to be bonded via the oxygen atom of the abovementioned groups replacing a CH$_2$ group in the radical X can also, in general, be transferred to aliphatic radicals, while both the ethylene radicals and higher aliphatic radicals, in particular comprising carbon chains having more than 3 carbon atoms, are bonded via the nitrogen atom. The t-butylene radical is preferred.

In araliphatic and aliphatic radicals X, it is preferred that a maximum of two CH$_2$ groups are replaced by radicals such as

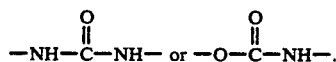

In the particularly preferred embodiments, the radical

as a replacement for a CH group only occurs once in a radical X.

In the abovementioned variants of the radicals R$^1$, R$^2$ and X, m is preferably an integer from 3 to 8 and n is an integer from 1 to 3, with m>n.

Particularly preferably, m is an integer from 3 to 6, and n is particularly preferably 1 or 2. I The polyfunctional compounds of the formula I according to the invention characterized in detail above are highly suitable as photoactive components in a radiation-sensitive mixture. In particular, the compounds according to the invention are suitable for exposure to radiation having a wavelength of from about 190 to 350 nm. The use of the polyfunctional compounds of the formula I and the preparation thereof are described in German Patent Application P 40 14 649.9, filed concurrently, corresponding to docket no. 16878/387, and U.S. Ser No. 07/694,386 now U.S. Pat. No. 5,191,069, which is incorporated in its entirety by reference.

The invention also relates to a process for the preparation of the polyfunctional compounds according to the invention containing $\alpha$-diazo-$\beta$-keto ester units and sulfonate units. It has proven particularly favorable first to synthesize suitable precursors for $\beta$-keto ester/sulfonates of the formula II and to convert the latter, in a subsequent reaction, into the $\alpha$-diazo-$\beta$-keto ester/sulfonates of the formula I by so-called diazo transfer (cf. M. Regitz et al., Org. Prep. Proced., 1, 99 (1969)):

Scheme 1

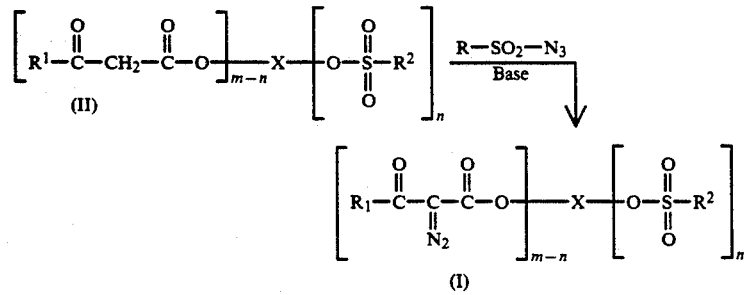

To this end, a $\beta$-keto ester/sulfonate of the formula II (in which $R^1$, $R^2$ and X are as defined in the formula I) is dissolved in from about 5 to 50 times, preferably 10 times, the amount of a suitable solvent (based on the mixture), and the solution is cooled to a temperature from about $-15°$ C. to $+15°$ C., preferably from about $-5°$ C. to $+5°$ C. Suitable solvents are alcohols, such as methanol and ethanol, alcohol ethers, such as ethylene glycol monomethyl ether, chlorinated hydrocarbons, such as dichloromethane and trichloromethane, or preferably aliphatic nitriles, such as acetonitrile, or mixtures of these solvents. Particularly preferred solvents are those which have a boiling point of from about 30° C. to 140° C. The actual reaction according to the invention can be carried out by 3 variants.

Variant A

The cooled solution is treated with about a 1- to 1.3-fold excess (based on the number of activated methylene groups to be reacted) of a diazo transfer reagent. Suitable transfer reagents are, in particular, aromatic and aliphatic sulfonyl azides, such as toluenesulfonyl azide, 4-carboxyphenylsulfonyl azide, 2-naphthalenesulfonyl azide or methylsulfonyl azide. The equimolar amount, based on the sulfonyl azide, of a base, preferably of a tertiary amine, is then added to the solution. The temperature of the mixture must be kept constant during this operation. Examples of preferred amines are triethylamine, triisopropylamine or diazobicyclo[2.2.2]octane. It is particularly preferred to use triethylamine as the base. The mixture obtained is stirred at the prespecified temperature for about 5 to 50 minutes, preferably from 10 to 15 minutes, warmed to room temperature and stirred for a further about 1 to 24 hours, preferably 2 to 4 hours. Depending on the type of sulfonyl azide employed, the resultant sulfonyl amide may precipitate, so that it can be filtered off, if desired, when the reaction is complete.

Variant B

As an alternative to variant A, it is also possible to add the sulfonyl azide to the $\beta$-keto ester/sulfonate of the formula II and the amine initially introduced under the above-described conditions while maintaining the temperature.

Variant C

However, a modified variant A has proved particularly favorable in which the solution of the $\beta$-keto ester/sulfonate of the formula II is first treated with only about a 0.7- to 0.9-fold excess (based on the number of activated methylene groups to be reacted) of a sulfonyl azide, preferably toluenesulfonyl azide, and all the amine is added while maintaining the prespecified temperature. The mixture is then stirred, if desired, with warming to room temperature. After from about 10 to 120 minutes, the toluenesulfonyl azide is no longer detectable by chromatography. The mixture is then recooled, if necessary, and this time treated with about a 0.6 to 0.1-fold excess of 4-carboxyphenylsulfonyl azide, giving a total excess of sulfonyl azide corresponding to variant A. The crude products prepared by this variant have high purity.

The mixture obtained by variants A to C is freed from solvent and excess reagents and taken up in an inert, water-immiscible solvent, in particular dichloromethane or diethyl ether. The mixture is washed twice with 5 to 25% strength potassium hydroxide solution to remove the sulfonyl amide residues and subsequently washed with water until neutral, dried over a suitable desiccant and again freed from solvent. The residue which remains, comprising, in particular when variant C is used, virtually exclusively pure $\alpha$-diazo-$\beta$-keto ester/sulfonate of the formula I, can be worked up by known methods, for example by crystallization or chromatography.

The $\beta$-keto ester/sulfonate of the formula II which is necessary for conversion into the polyfunctional compounds of the formula I according to the invention containing $\alpha$-diazo-$\beta$-keto ester units and sulfonate units can be prepared in various ways known from the literature:

1. In accordance with scheme 2, a reaction takes place between a monofunctional 5-acyl-2,2-dialkyl-1,3-dioxane-4,6-dione (5-acyl derivative of Meldrum's acid)

of the formula III and a polyhydric alcohol sulfonate of the formula IV to give the polyfunctional β-keto ester/sulfonate of the formula II. The preparation of 5-acyl derivatives of Meldrum's acid of the formula III and their conversion into β-keto esters is known for monofunctional compounds and can be carried out, for example, analogously to the procedures of Y. Oikawa et al., J. Org. Chem., 43, 2087 (1987), by reacting acid chlorides with Meldrum's acid, or analogously to the procedures of P. Houghton and D. J. Lapham, Synthesis, 1982, 451 ff. Examples of the conversion into polyfunctional β-keto esters in accordance with the abovementioned literature can also be found in German Patent Applications P 39 00 735.9 and P 39 00 736.7, (corresponding to U.S. Ser. Nos. 07/464,003 and 07/466,007 respectively) which are not pre-priority publications. The products are isolated in their enol form.

to 100° C. The commencement of the reaction can be seen from the vigorous evolution of carbon dioxide. The mixture is stirred at the prespecified temperature for about 1 to 6 hours, preferably 2 to 3 hours, until $CO_2$ evolution can no longer be observed.

The solvent is subsequently removed in vacuo. Although the particular β-keto ester/sulfonate of the formula II is produced in high purity, the product may, if desired, be further purified by methods known to those skilled in the art.

Particularly suitable 5-acyl derivatives of Meldrum's acid of the formula III are those in which $R^1$ is cyclobutyl, butyl, pentyl, cyclopentyl, hexyl, cyclohexyl, heptyl, octyl, nonyl, adamantyl or higher alkyl radicals having up to about 22 carbon atoms, which may be substituted, if desired, by further alkyl radicals, alkoxyalkyl radicals, aryl radicals, alkoxyaryl radicals, arylox- Scheme 2

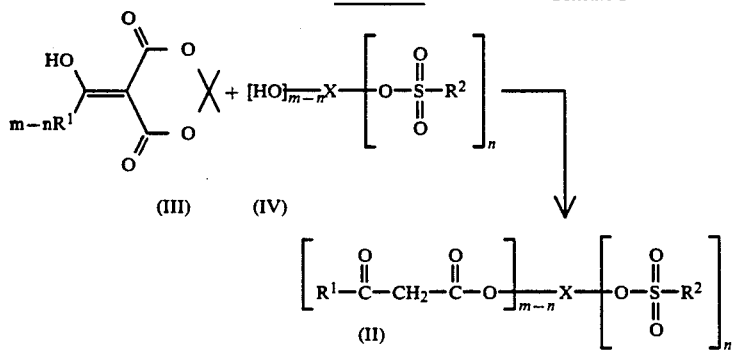

2. In accordance with scheme 3, the reaction takes place between a monofunctional β-keto ester, preferably a methyl or ethyl ester of the formula V, with a polyhydric alcohol/sulfonate of the formula IV to give the polyfunctional β-keto ester of the formula II. The transesterification reaction for the preparation of monofunctional β-keto esters is known and is described by A.R. Bader et al. in J. Am. Chem. Soc., 73, 4195 ff., (1951).

yaryl radicals, halogen atoms or by other polyfunctional groups, for example by terminal acid ester functions, or in which individual $CH^2$ groups may be replaced by oxygen or sulfur atoms or by groups such as —C(O)-O—, —C(O)—$NR^3$—, —$NR^3$—C(O)—$NR^4$, —O—C(O)—$NR^3$, —O—C(O)—O— or —$NR^3$—, in which $R^3$ and $R^4$ are as defined above.

Particularly preferred radicals $R^1$ are 2-phenylethyl, t-butyl, n-hexyl, 2,5-dioxahexyl, cyclopentyl, cyclo- Scheme 3

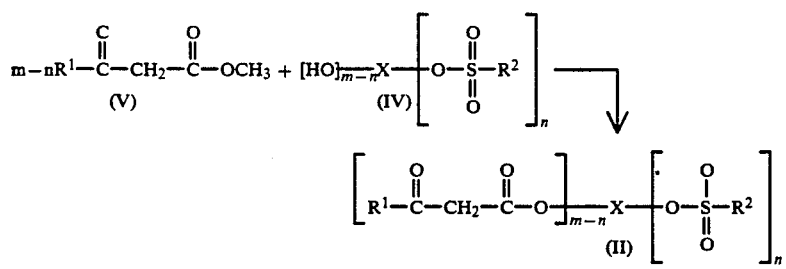

In the reaction sequence of scheme 2, the particular 5-acyl derivative of Meldrum's acid of the formula III is treated with the amount necessary to give the desired degree of reaction of the particular polyfunctional alcohol sulfonate of the formula IV, the mixture is subsequently dissolved in from about 5 to 20 times, preferably 10 times, the amount of a solvent which does not react with alcohols or Meldrum's acid, for example a ketone, such as acetone or ethyl methyl ketone, or an ether, such as 1,2-dimethoxyethane, or dioxane, if necessary with heating. The clear solution is heated to a temperature of from about 60° to 120° C., preferably to from 80° hexyl, benzyl, phenoxymethyl and nonyl. The t-butyl, cyclohexyl and phenoxymethyl radicals are especially preferred.

The alcohol sulfonates of the formula IV which are necessary for the reaction as in scheme 2 can be prepared by various procedures known from the literature:

1) According to scheme 4, the reaction of the polyfunctional alcohols of the formula VI is carried out with appropriate reagents to form partially protected alcohols of the formula VII. The hydroxyl group or groups which are still free are reacted with sulfonyl chlorides of the formula VIII in the presence of a base to give the protected alcohol sulfonates of the formula IX. Removal of all the protective groups present gives the polyfunctional alcohol sulfonates of the formula IV. The protective group technique is described in detail by T. W. Greene in "Protective Groups in Organic Synthesis", 1st Edition, pp. 10–113, Wiley & Sons, New York, 1981, with reference to various examples.

hols of the formula VII must be base-stable. Products of the reaction of alcohols with protective group-forming reagents are, in particular, substituted methyl and ethyl ethers, silyl ethers, esters, carbonates, cyclic acetals and ketals and cyclic ortho-esters. For alcohols of the formula VI which contain 1,2- or 1,3-hydroxyl groups, cyclic acetals and ketals and ortho-esters are possible. Preference is given to reagents which result in the formation of cyclic ketals, particular preference being

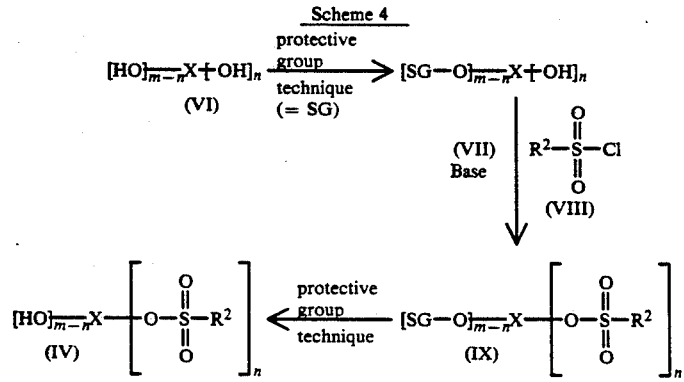

2) In accordance With scheme 5, the reaction takes place between a polyhydric alcohol of the formula VI and the desired amount of a monofunctional sulfonyl chloride of the formula VIII to give mono- ($m=3$, 4 or 5), bis- ($m=6$ or 8) and trifunctional ($m=8$) sulfonates and/or an isomeric mixture of various sulfonate-containing alcohols of the formula IV. The preparation of sulfonates from alcohols is known for monofunctional compounds and is described in detail, for example, by E. Schaumann in "Methoden der organischen Chemie" [Methods of Organic Chemistry] (Houben-Weyl-Müller, Eds.), 4th Edition, Vol. 6/1b, p. 874, Thieme-Verlag, Stuttgart, 1984, and the literature cited therein).

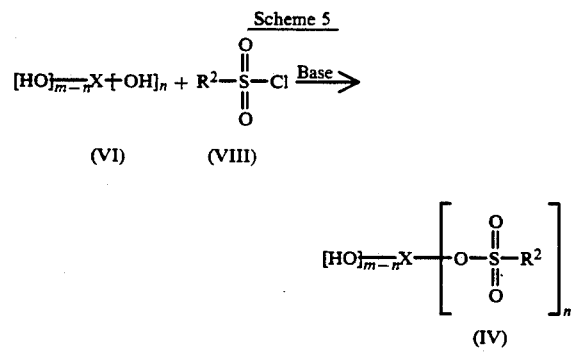

In the reaction sequence according to scheme 4, the particular polyfunctional alcohol of the formula VI is treated with the amount of a suitable protective-group reagent necessary for the desired degree of conversion and a catalytic amount of an acid, giving partially protected alcohols of the formula VII. The type and amount of the protective-group reagents used depend on the structure of the polyfunctional alcohols VI. The acid and the chosen reaction conditions depend on the protective-group reagent used. Since bases are employed for deprotonation in the formation of the protected sulfonates of the formula IX, the protected alcogiven to acetonide- (isopropylidene-)protected 1,2- and 1,3-alcohols.

Acetonides (1,2- or 1,3-O,O-isopropylidene ketals) can be obtained by reacting 1,2- and 1,3-alcohols of the formula VI with, for example, 2-methoxypropene, 2-ethoxypropene, 2 -(trimethylsilyloxy)propene, acetone or 2,2-dimethoxypropane in the presence of catalytic amounts of acid. Particular preference is given to the reaction of alcohols containing 1,2- or 1,3-hydroxyl groups in anhydrous acetone, since the protective group-forming reagent simultaneously functions as the solvent here.

In the reaction sequence of scheme 4, the alcohols containing 1,2- or 1,3-hydroxyl groups are warmed with about 2 to 20 times, preferably 5 to 12 times, the amount of acetone. If necessary, one or more further solvents may be added in order to achieve better solubility or to correspondingly increase the reaction temperature. After addition of a catalytic amount of acid, preferably p-toluenesulfonic acid, the mixture is stirred for about 1 to 24 hours, preferably from 3 to 8 hours at 20° to 85° C., preferably at 35°–60° C., and subsequently treated with about 1 to 10 times, preferably 2 to 5 times, the amount of potassium carbonate (based on the amount of p-toluenesulfonic acid employed) or another base.

After cooling, the mixtures, which are usually cloudy, are filtered via a separation aid, such as Hydro Super Gel, kieselguhr, silica gel, etc. The solvent is subsequently removed by vacuum distillation. The product is purified by methods known to a person skilled in the art, for example by high-vacuum distillation.

Polyfunctional alcohols of the formula VI which contain no 1,2- or 1,3-hydroxyl groups are protected, in particular, by conversion into ethers. Substituted methyl ethers and silyl ethers are preferred. Tetrahydropyranyl ethers are particularly preferred. These are preferably synthesized by two different routes, described by A. Bongini, G. Cardillo, M. Orena, S. Sandri, Synthesis 1979, 618 (Variant A) and by M. Miyashita, A. Yoshikoshi, P. A. Grieco, J. Org. Chem. 42 (1977) 3772 (Variant B).

Variant A

In the reaction sequence of scheme 4, the alcohols containing no 1,2- or 1,3-hydroxyl groups are dissolved with an amount corresponding to the desired degree of reaction of 3,4-dihydro-2H-pyran in about 1 to 20 times, preferably 2 to 10 times, the amount of hexane, and added to a suspension of acidic ion exchanger resin (Amberlyst H-15, 0.05 to 2 times, preferably 0.1 to 0.5 times the amount, based on the amount of hydroxyl groups employed) in hexane (amount as above). If necessary, one or more further solvents, such as, for example, methanol, can be added in order to achieve better solubility. The mixture is stirred at about 0° to 85° C., preferably at from 20° to 50° C., for about 0.5 to 24 hours, preferably from to 5 hours, and the resin is subsequently filtered off. The solvent is subsequently removed by vacuum distillation. The residue which remains, which contains virtually exclusively the isomeric alcohols, is separated by chromatography.

Variant B

In the reaction sequence of scheme 4, the alcohols containing no 1,2- or 1,3-hydroxyl groups are dissolved with an amount corresponding to the desired degree of reaction of 3,4-dihydro-2H-pyran in about 5 to 300 times, preferably 20 to 100 times, the amount of dichloromethane, and treated with pyridinium p-toluenesulfonate (from about 0.02 to 1 times, preferably from about 0.05 to 0.3 times, the molar amount, based on the number of hydroxyl groups to be reacted). If desired, further solvents may be added. The mixture is subsequently stirred at about 0° to 80° C., preferably at from 10° to 45° C., for from 0.5 to 48 hours, preferably 2.5 to 8 hours, and subsequently treated with about 5 to 100 times, preferably 10 to 50 times, the amount of ether (based on the amount of solvent employed). The product is washed with partially saturated solutions of sodium chloride and with water. The mixture is dried using sodium sulfate, and the solvent is removed by vacuum distillation. The residue which remains, which contains virtually exclusively the isomeric alcohols, is separated by chromatography.

The partially protected alcohol of the formula VII, corresponding to the desired degree of reaction, is obtained as the main product in both variants.

The hydroxyl group or groups which are still free in the partially protected alcohols of the formula VII are reacted with sulfonyl chlorides of the formula VIII in the presence of a base, giving the protected alcohol sulfonates of the formula IX.

In the reaction sequence of scheme 4, the partially protected alcohols of the formula VII are dissolved with about 0.5 to 40 times, preferably 2 to 10 times, the amount of a base and stirred at about −40° to 65° C., preferably at from −15° to 25° C., for about 0.1 to 10 hours, preferably 0.5 to 1 hour. Particularly preferred bases are basic amines, such as, for example, pyridine, triethylamine, N-methylmorpholine, etc., but N-methylmorpholine is very particularly preferred. If desired, one or more further solvents, such as, for example, acetonitrile, may be added in order, for example, to achieve better solubility or to increase the reaction rate. The desired sulfonyl chloride VIII (about 1 to 3 times, preferably 1.05 to 1.5 times, the amount, based on the hydroxyl groups still present in the alcohol employed) is then added to the mixture, which is stirred at about −40° to 65° C., preferably at about −15° to 25° C., for about 0.5 to 48 hours, preferably 2 to 8 hours. Dichloromethane/water is subsequently added to the mixture, the organic phase is washed until neutral by methods known to a person skilled in the art and dried using sodium sulfate, and the solvent is removed by vacuum distillation.

Although the residues which remain principally comprise the partially protected alcohol sulfonates of the formula IX (and are generally employed in the next step without further purification), the product can, if desired, be further purified by methods known to a person skilled in the art.

In the reaction sequence of scheme 4, the protective groups of the partially protected alcohol sulfonates of the formula IX are all removed in the presence of a catalytic amount of acid, giving the alcohol sulfonates of the formula IV. The type and amount of acid used depends on the protective group employed above. Thus, acetonide protective groups (O,O-isopropylidene acetals) are preferably removed using aqueous HCl solutions of various concentration, using acetic acid, using p-toluenesulfonic acid and/or using acidic ion exchanger resins. The same reagents are used to cleave the tetrahydropyranyl ethers into the corresponding alcohols.

In the cleavage of the cyclic ethers as in scheme 4, the partially protected alcohol sulfonates of the formula IX are dissolved in from about 5 to 200 times, preferably 10 to 50 times, the amount of a solvent, and treated with aqueous hydrochloric acid until the pH is $\approx 1$. The solvents used are alcohols, ethers, water, organic acids, ketones or mixtures of these solvents Preference is given to alcohols and ethers, such as, for example, methanol or tetrahydrofuran, but also mixtures comprising tetrahydrofuran, acetic acid or dilute hydrochloric acid and water. Methanol is particularly preferred A catalytic amount of p-toluenesulfonic acid is subsequently added, and the mixture is stirred at about −25° to 80° C., preferably at from 0° to 45° C., for about 1 to 18 hours, preferably 2 to 7 hours. The pH of the mixture is subsequently adjusted to slightly alkaline (pH $\approx 8$ to 9) by adding alcoholic potassium hydroxide solution, and the solvent is removed by vacuum distillation. The residue is separated by column chromatography on silica gel, giving the desired alcohol sulfonates of the formula IV, usually as colorless compounds. Preferred eluents for the column chromatography are dichloromethane, ethyl acetate, ether, hexane, petroleum ethers of various boiling fractions, tetrahydrofuran, trichloromethane and mixtures of these eluents. Dichloromethane and mixtures thereof are particularly preferred.

In accordance with scheme 5, the reaction between a polyhydric alcohol of the formula VI containing no 1,2 or 1,3-hydroxyl groups and sulfonyl chlorides can also be carried out without using protective-group techniques. The reaction with the desired amount of a monofunctional sulfonyl chloride of the formula VIII gives mono- (m=3, 4 or 5), bis- (m=6 or 8) and trifunctional (m=8) sulfonates and/or an isomer mixture of various sulfonate containing alcohols of the formula IV.

The same conditions as described explicitly for the reaction step VII-IX in scheme 4 apply to these reactions The alcohols of the formula VI may be trifunctional, tetrafunctional or higher-functional alcohols; preference is given to alcohols which contain from 3 to 6 OH groups per molecule Trifunctional alcohols are preferably derived from glycerol, from higher $\alpha,\beta,\omega$-triols or from triethanolamine, it also being possible to use longer-chain derivatives, in particular ethoxylated compounds, such as, for example, 1,3,5-tris(2-hydroxyethyl)cyanuric acid, equally well here Specific mention is made of glycerol, 2-hydroxymethyl-2-methylpropane-1,3-diol, 2-ethyl-2-hydroxymethylpropane-1,3-diol, 2,3-isopropylideneerythruronic acid, hexane-1,2,6-triol, 1,1,1-triethanolamine, 1,1,1-tripropanolamine and partially acetalated or ketalated sugar derivatives.

In addition, products of the reaction of tetrafunctional alcohols or aminotriols with acid derivatives, isocyanates or cyclic carbonates can also be used. Higher functional alcohols of the formula VI are derived, for example, from products of the condensation of glycerol, or of pentaerythritol or from products of the reaction of bifunctional acid derivatives or isocyanates with higher functional alcohols or amino alcohols. The list of alcohols which can be used is thus not complete by far; virtually any alcohol can be used which contains no group which is reactive toward acid esters, or which reacts under the reaction conditions described clearly to form esters.

In the preparation of $\beta$-keto ester/sulfonates of the formula II by transesterification as in scheme 3, monofunctional $\beta$-keto esters of the formula V are employed with alcohol sulfonates of the formula IV by reacting about a 5 to 200%, preferably a 10 to 50%, excess of a $\beta$-keto ester, for example a methyl or ethyl ester, which has been esterified with a low-molecular-weight alcohol, at about 100° to 160° C., preferably at from 120° to 140° C. In order to increase the solubility of the alcohol sulfonate of the formula IV in the $\beta$-keto ester of the formula V, a solubilizer, such as dimethylformamide or N-methylpyrrolidone, may be added if necessary. The equilibrium can be shifted continuously in the desired direction by applying a weak vacuum of from about 800 to 20 mm Hg, preferably from 400 to 100 mm Hg, due to the lower alcohol formed distilling off. After the theoretical amount of lower alcohol has distilled off, the excess $\beta$-keto ester of the formula V, which has a low degree of esterification, and, if appropriate, the solubilizer added are removed by distillation in a high vacuum. The residue remaining is the $\beta$-keto ester/sulfonate of the formula II, which is frequently produced in oily form and usually in very high purity, so that it can be used for the diazo transfer without further purification.

Some of the $\beta$-keto esters of the formula V with a low degree of esterification which are necessary in this reaction sequence are commercially available and some can be prepared by numerous methods known from the literature. Particular preference is given here to their preparation from the corresponding 5-acyl derivatives of Meldrum's acid of the formula III Although an additional reaction step is carried out here compared with process variant 1, better yields and/or higher purity $\beta$-keto ester/sulfonates of the formula II can be achieved using this variant.

A radiation-sensitive mixture according to the invention can contain one or more compounds of the formula I which contain $\alpha$-diazo-$\beta$-keto ester units and sulfonate units, in particular in equal proportions. It is preferable, however, if the mixture contains only one photoactive compound. The concentration of the compound containing $\alpha$-diazo-$\beta$-keto ester units and sulfonate units and having the formula I in the radiation-sensitive mixture according to the invention may vary within wide limits. In general, however, its concentration is in the range from about 4 to 40% by weight, in particular about 10 to 35% by weight, based on the nonvolatile components of the radiation-sensitive mixture.

The radiation-sensitive mixture according to the invention further contains at least one polymeric binder which is insoluble in water but soluble, or at least swellable, in aqueous alkaline solutions. In particular, the binder is remarkable for the fact that it readily dissolves the components of the radiation-sensitive mixture according to the invention and in particular has as low an inherent absorption, i.e. as high a transparency, as possible in the wavelength range from about 190 to 300 nm. These do not include, in particular, binders based on novolak condensation resins which are, as a rule, used in combination with naphthoquinone diazides as photoactive components. Although novolak condensation resins exhibit a reduction in solubility with respect to aqueous alkaline developers in the unexposed regions after imagewise exposure, their inherent absorption in the wavelength range desired for the exposure is undesirably high.

The said novolak condensation resins can, however, be used in a mixture with other resins which are suitable as binders and have higher transparencies. In this connection, the mixing ratios depend primarily on the nature of the binder to be mixed with the novolak resin. In particular, its degree of inherent absorption in the said wavelength range and also the miscibility with the other components of the radiation-sensitive mixture play a decisive role. In general, the binder of the radiation-sensitive mixture according to the invention may contain up to about 30% by weight, in particular up to about 20% by weight, of a novolak condensation resin.

Suitable binders are homopolymers and copolymers of p-hydroxystyrene and its alkyl derivatives, for example of 3-methylhydroxystyrene, and also homopolymers and copolymers of other polyvinylphenols, for example of 3-hydroxystyrene, or the esters or amides of acrylic acid with aromatics containing phenolic groups. Polymerizable compounds such as styrene, methacrylates, acrylates or the like can be used as comonomers in the copolymer.

Mixtures having increased plasma resistance are obtained if vinyl monomers containing silicon, for example vinyltrimethylsilane, are used to prepare copolymers of the above type. The transparency of these binders is in general higher in the range which is of interest, with the result that an improved structuring is possible.

Homopolymers or copolymers of maleimide can also be used with equal success. These binders also exhibit high transparency in the wavelength range described. Here again, styrene, substituted styrenes, vinyl ethers, vinyl esters, vinylsilyl compounds or (meth)acrylates are preferably used as comonomers.

Finally, it is also possible, in addition, to use copolymers of styrene with comonomers which bring about an increase in solubility in aqueous alkaline solutions. These include, for example, maleic anhydride, half-esters of maleic acid or the like.

The said binders may occur in mixtures, provided they are miscible and do not impair the optical qualities of the radiation-sensitive mixture. Preferred, however, are binders containing a species of the abovementioned types.

A radiation-sensitive mixture according to the invention contains about 60 to 96% by weight, in particular about 65 to 94% by weight, of a binder, based on the proportion of nonvolatile components in the radiation-sensitive mixture.

Furthermore, dyes, pigments, wetting agents, adhesion promoters and flow-control agents may optionally be added to the radiation-sensitive mixture according to the invention to improve specific requirements such as flexibility, adhesion and luster.

Preferably, the radiation-sensitive mixture according to the invention is dissolved in solvents such as ethylene glycol, glycol ethers (such as glycol monomethyl ether, glycol dimethyl ether, glycol monoethyl ether or propylene glycol monoalkyl ethers, in particular propylene glycol methyl ether), aliphatic esters (such as ethyl acetate, hydroxyethyl acetate, alkoxyethyl acetate, $\gamma$-butyl acetate, propylene glycol monoalkyl ether acetate, in particular propylene glycol methyl ether acetate or amyl acetate), ethers (such as dioxane), ketones (such as methyl ethyl ketone, methyl isobutyl ketone, cyclopentanone and cyclohexanone), dimethylformamide, dimethylacetamide, hexamethylphosphoramide, N-methylpyrrolidone, butyrolactone, tetrahydrofuran and in mixtures of the same. Particularly preferred are glycol ethers, aliphatic esters and also ketones. In addition, it is possible to use solvent mixtures which also contain, inter alia, aromatic hydrocarbons or xylene. The choice of solvent ultimately depends on the coating method used, the desired coating thickeners and the drying conditions. The solvents must also be chemically neutral, i.e. they must not react irreversibly with the other coating components.

The solutions produced with the other components of the radiation-sensitive mixture have, as a rule, a solids content of about 5 to 60% by weight, preferably up to 50% by weight.

According to the invention, a radiation-sensitive recording material is also provided which comprises a substrate and a radiation-sensitive mixture as herein described applied thereto.

Suitable substrates are all those materials of which capacitors, semiconductors, multilayer printed circuits or integrated circuits are composed or from which they can be produced In particular, mention may be made of surfaces composed of pure silicon layers and thermally oxidized and/or aluminum-coated silicon material which may optionally also be doped, including all the other substrates which are standard in semiconductor technology such as, for example, silicon nitride, gallium arsenide and indiumphosphide. Suitable substrates are furthermore those known from liquid-crystal display production such as glass, indium-tin oxide, and also metal plates and foils composed, for example, of aluminum, copper or zinc; bimetallic and trimetallic foils, and also electrically nonconducting foils which have been vapor-coated with metals, $SiO_2$ materials optionally coated with aluminum, and paper. These substrates may be subjected to a thermal pretreatment, superficially roughened, incipiently etched or treated with chemicals to achieve desired properties such as, for example, an increase in the hydrophilic nature.

In a particular embodiment, the radiation-sensitive mixture may contain an adhesion promoter to improve adhesion in the resist or between the resist and the substrate. In the case of silicon or silicon dioxide substrates, suitable adhesion promoters for this purpose are of the aminosilane type such as, for example, 3-aminopropyltriethoxysilane or hexamethyldisilazane.

Examples of bases which can be used to produce photomechanical recording layers such as printing plates for letterpress printing, lithography, screenprinting, gravure printing and also relief copies are aluminum plates, optionally anodically oxidized, grained and/or silicatized aluminum plates, zinc plates, steel plates which have optionally been treated with chromium, and also plastic films or paper.

The recording material according to the invention is exposed imagewise. Sources of actinic radiation are: metal halide lamps, carbon arc lamps, xenon lamps and mercury vapor lamps. An exposure can also be carried out with high-energy radiation such as laser, electron or X-ray radiation. Particularly preferred, however, are lamps which are capable of radiating light having a wavelength of 190 to 260 nm, i.e., in particular, xenon and/or mercury vapor lamps. In addition, it is also possible to use laser light sources, for example excimer lasers, in particular KrF or ArF lasers which emit at 248 and 193 nm, respectively. The radiation sources must have an adequate emission in the said wavelength ranges, but on the other hand, also be sufficiently transmissive for actinic light of the said range.

The invention furthermore relates to a process for producing a radiation-sensitive recording material. The radiation-sensitive mixture can be applied to the substrate by spraying, rolling, knife application, casting, by flow coating, spin coating and immersion coating or by means of wide-slot dies. The solvent is then removed by evaporation, with the result that the radiation-sensitive coating remains behind on the surface of the substrate. The removal of the solvent may optionally be promoted by heating the coating to temperatures of up to 140° C. The mixture may, however, also be first applied in the above-mentioned way to the intermediate base from which it is transferred to the final base material under pressure and elevated temperature.

The coating thickness varies as a function of its field of application. It is between about 0.1 and 100 $\mu$m, in particular between about 0.3 and 10 $\mu$m.

The coating is then exposed imagewise. Normally, actinic radiation is used For the purpose of irradiation, use is preferably made of UV lamps which emit light having a wavelength of about 190 to 300 nm. An image pattern is then uncovered in the radiation-sensitive coating by development, the coating being treated with a developing solution which dissolves or removes the irradiated regions of the material.

The developers used are solutions of reagents such as, for example, silicates, metasilicates, hydroxides, hydrogen- or dihydrogenphosphates, carbonates or hydrogencarbonates, of alkali and/or alkaline earth, in particular of ammonium ions and also of ammonia, and the like Metal-ion-free developers are described in U.S. Pat. No. 4,729, 941, U.S. Pat. No. 4,628,023 and U.S. Pat. No. 4,141,733 and in EP 0,097,282, EP 0,062,733 and EP 0,023,758. The content of these substances in the developer solution is, in general, about 0.1 to 15% by weight, preferably 0.5 to 5% by weight, based on the weight of the developer solution. Metal-ion-free developers are used in particular. Small amounts of a wetting agent may optionally be added to the developers in order to facilitate the stripping of the exposed places in the developer.

The resist structures developed are optionally postcured. This is done, in general, by heating the resist structure on a hot plate to a temperature below the flow temperature and then exposing the entire area with UV light from a xenon-mercury vapor lamp (range from 200 to 250 nm). This postcuring crosslinks the resist structures, with the result that the structures in general have a flow resistance up to temperatures of over 200° C. The postcuring can also be carried out without increasing the temperature by irradiating with UV light. This is the case, in particular, if high-energy radiation, for example electron radiation, is used.

The radiation-sensitive mixture according to the invention is preferably used in lithographic processes for producing integrated circuits or discrete electrical assemblies. The recording material produced from the mixture then serves as a mask for the subsequent processing steps. These include, for example, the etching of the coating base, the implantation of ions in the coating base or the deposition of metals or other materials on the coating base.

Under the normal practical conditions with exposure in the DUV range, the mixtures according to the invention exhibit a comparable high photosensitivity compared with the known materials (for Comparison Example see below) when they are irradiated with light having a wavelength of 190 to 300 nm. However, the advantages they exhibit are a higher thermal stability than the known materials and an outstanding compatibility.

The following examples illustrate the preparation of the polyfunctional compounds of formula I which contain α-diazoketo ester units and sulfonate units in the molecule.

APPLICATION EXAMPLES

The following examples reflect some possible applications of the radiation-sensitive mixtures according to the invention. These are intended to have only an illustrative nature, but not to limit the invention. In the examples parts by weight (pbw) are to parts by volume (pbv), or g to cm$^3$, as 1 to 1.

EXAMPLE 1

A radiation-sensitive mixture is prepared which contains
0.19 pbw of 1,2,10,11-tetra(4-cyclohexyl-3-diazo-2,4-dioxo-1-oxabutyl)triglyceryl 4-bromophenylsulfonate (Example 10 of docket no. 16878/387) and
0.75 pbw of poly(3-methyl-4-hydroxystyrene) in
4.25 pbw of propylene glycol monomethyl ether acetate.

1.5 ml of this solution are filtered through a filter having a pore diameter of 0.2 μm and applied to a silicon wafer having a diameter of 7.62 cm. Rotation of the wafer at 3,000 rev/min for 45 s produces a homogeneous coating which has a thickness of 1 03 μm after it is dried in a circulating air oven at 90° C. for 30 min.

The wafer coated in this way is irradiated imagewise through a photomask with the UV radiation from a xenon-mercury vapor lamp at 260 nm with an energy of 170 mJ/cm$^2$.

The imagewise irradiated coating is then developed with a 0.23N aqueous solution of tetramethylammonium hydroxide for 80 s. The removal of the coating in the unexposed regions (dark removal) was less than 10 nm. The solubility ratio (ratio of the removal rate of the exposed resist regions to the dark removal) was about 13. Structures, even those with dimensions of less than 1.0 μm, were cleanly resolved, with good edge stability.

EXAMPLE 2

A radiation-sensitive mixture is prepared which contains
0.28 pbw of the 2-(benzoylaminomethyl)thiophene 5-sulfonic acid ester of 2,10-diazo-1,11-dicyclohexyl-4,8-dioxa-6-ethyl-6-hydroxymethyl-1,3,9,11-tetraoxoundecane (Example 2 of docket no. 16878/387) and
0.75 pbw of poly(3-methyl-4-hydroxystyrene) in
4.25 pbw of propylene glycol monomethyl ether acetate.

A radiation-sensitive mixture is produced from this solution using the information from Example 1. Exposure and development are carried out analogously to Example 1. However, an exposure energy of 210 mJ/cm$^2$ is used for the exposure. It was possible to obtain structures with good edge definition. The solubility ratio was found to be 16.

EXAMPLE 3

A radiation-sensitive mixture is prepared which contains
0.28 pbw of the 3-phenylpropylsulfonic acid ester of 1,11-diadamantyl-2,10-diazo-4,8-dioxa-6-hydroxymethyl-6-methyl-1,3,9,11-tetraoxoundecane (Example 8 of docket no. 16878/387) and
0.75 pbw of poly(3-methyl-4-hydroxystyrene) in
4.25 pbw of propylene glycol monomethyl ether acetate
and processed further in accordance with Example 2. With an imagewise irradiation with an energy of 170 mJ/cm$^2$, it was possible to obtain structures with good edge definition. The solubility ratio was about 13.

EXAMPLE 4

A radiation-sensitive mixture is prepared which contains
0.25 pbw of the 4-tert-butylphenylsulfonic acid ester of 2,10-diazo-1,11-dicyclohexyl-4,8-dioxa-6-ethyl-6-hydroxymethyl-1,3,9,11-tetraoxoundecane (Example 1 of docket no. 16878/387) and
0.75 pbw of poly(3-methyl-4-hydroxystyrene) in
4.25 pbw of propylene glycol monomethyl ether acetate.

1.5 ml of this solution are filtered through a filter having a pore diameter of 0.2 μm and applied to a silicon wafer having a diameter of 7.62 cm. Rotation of the wafer at 3,000 rev/min for 45 s produces a homogeneous coating which has a thickness of 0.88 μm after it is dried in a circulating air oven at 90° C. for 30 min.

The wafer coated in this way is irradiated imagewise through a photomask with the UV radiation from a xenon-mercury vapor lamp at 260 nm with an energy of 150 mJ/cm$^2$.

The imagewise irradiated coating is then developed with a 0.27N aqueous solution of tetramethylammonium hydroxide for 90 sec. The removal of the coating in the unexposed regions (dark removal) was less than 20 nm. The solubility ratio (ratio of the removal rate of the exposed resist regions to the dark removal) was about 14. Structures, even those with dimensions of less than 1.0 μm, were cleanly resolved, with good edge stability.

EXAMPLE 5

A radiation-sensitive mixture is prepared which contains 0.19 pbw of 1,2,10,11-tetra(4-cyclohexyl-3-diazo-2,4-dioxo-1-oxabutyl)triglyceryl 4-bromophenylsulfonate (Example 10 of docket no. 16878/387) and
0.55 pbw of poly(styrene-co-maleimide) (1:1) in
4 25 pbw of cyclohexanone.

1.5 ml of this solution is filtered by means of a filter having a pore diameter of 0.2 μm and applied to a silicon wafer rotating at 2,800 rev/min and having a diameter of 7.62 cm. A homogeneous coating can be obtained after 45 s. After drying the coating at 90° C. for 30 min, the coating thickness of the homogeneous radiation-sensitive coating is 0.98 μm.

The coated wafer is then exposed imagewise through a photomask at a wavelength of 260 nm. A xenon-mercury vapor lamp is used as UV radiation source. The exposure energy is 160 mJ/cm$^2$.

It was then possible to satisfactorily develop the coating within 60 s with a 0.02N aqueous solution of tetramethylammonium hydroxide. The dark removal was less than 30 nm and in addition, an adequate differentiation was observed between exposed and unexposed resist regions (solubility ratio=15).

EXAMPLES 6 TO 15

Radiation-sensitive mixtures were prepared and processed analogously to Example 5, but using the photoactive compounds listed below. In all cases, a good differentiation between exposed and unexposed regions was obtained, resulting in a high resolution.

| Example | Photoactive component | Solubility ratio (ratio of removal of exposed areas to dark removal) |
|---|---|---|
| 6 | 1,2,14,15-tetra(4-tert-butyl-3-diazo-2,4-dioxo-1-oxabutyl)tetraglyceryl 6,10-bis(phenylsulfonate) (Example 12 of docket no. 16878/387) | 13 |
| 7 | p-nitrophenylsulfonic acid ester of 4,12-diazo-6,10-dioxa-1,15-diphenyl-8-ethyl-8-hydroxy-methyl-3,5,11,13-tetraoxopenta-decane (Example 22 of docket no. 16878/387) | 8 |
| 8 | 3-chloropropylsulfonic acid ester of 1,13-bis(phenoxy)-3,11-diazo-5,9-dioxa-7-ethyl-7-hydroxymethyl-2,4,10,12-tetraoxotridecane (Example 4 of docket no. 16878/387) | 11 |
| 9 | p-toluenesulfonic acid ester of 1,3-bis(5-diazo-7,7-dimethyl-4,6-dioxo-3-oxaoctyl)-5-(2-hydroxyethyl)-cyanuric acid (Example 42 of docket no. 16878/387) | 7 |
| 10 | methylsulfonic acid ester of N-cyclohexyl-N'-[1,1-bis(4-diazo-3,5-dioxo-2-oxa-7-phenylheptyl)-1-hydroxymethyl]methylurea (Example 39 of docket no. 16878/387) | 8 |
| 11 | p-toluenesulfonic acid est of bis(5-diazo-4,6-dioxo-3-oxa-decyl)-(2-hydroxyethyl)amine (Example 31 of docket no. 16878/387) | 14 |
| 12 | p-(trifluoromethyl)phenyl-sulfonic acid ester of 1,1-bis-[4-(6-diazo-1,4-dioxa-5,7-dioxo-tridecyl)phenyl]-1-[4-(3-hydroxy-1-oxapropyl)phenyl]ethane (Example 46 of docket no. 16878/387) | 12 |
| 13 | p-(trifluoromethyl)phenyl-sulfonic acid ester of N-(hydroxymethyl)-N,N',N'-tris(4-diazo-3,5-dioxo-7-methyl-2-oxaoctyl)ethylenediamine (Example 60 of docket no. 16878/387) | 9 |
| 14 | mixture of equal parts by weight of the compounds according to Example 23 and Example 59 of docket no. 16878/387) | 8 |
| 15 | isomeric mixture composed of the isopropylsulfonic acid esters of 5,12-diazo-1,16-diphenyl-8-hydroxymethyl-2,7,10,15-tetra-oxa-4,6,11,13-tetraoxohexadecane and 5,13-diazo-1,17-diphenyl-9-hydroxymethyl-2,7,11,16-tetra-oxa-4,6,12,14-tetraoxoheptadecane (Example 17 of docket no. 16878/387) | 17 |

EXAMPLE 16

A radiation-sensitive mixture is prepared which contains 0.19 pbw of the compound from Example 69 of docket no. 16878/387) and 0.55 pbw of poly(styrene-co-maleimide) (1:1) in 4.25 pbw of cyclohexanone.

1.5 ml of the solution are filtered through a filter having a pore diameter of 0.2 μm and spun onto a silicon wafer having a diameter of 7.62 cm, and a homogeneous coating is produced by rotating the wafer at 3,200 rev/min within 45 s. The coating thickness after drying at 90° C. for 30 min in a circulating air oven is 0.97 μm.

The coated wafer is irradiated through a photomask with UV radiation from a xenon-mercury vapor lamp in the region of 260 nm with an exposure energy of 150 mJ/cm$^2$. Development is then carried out with a 0.24N aqueous solution of tetraethylammonium hydroxide within 60 s. The dark removal was less than 50 nm/min. If an exposure energy of 122 mJ/cm$^2$ was used, it was possible to resolve 1 μm structures cleanly and with good edge definition. At the same time, the unexposed regions were 18 times more sparingly soluble than the exposed regions.

EXAMPLE 17 (COMPARISON EXAMPLE)

A radiation-sensitive mixture is prepared which contains 0.19 pbw of the compound (54) from the Comparison Example 73 of docket no. 16878/387) and 0.55 pbw of poly(styrene-co-maleimide) (1:1) in 4.25 pbw of cyclohexanone.

The mixture is processed analogously to Example 16. However, it was found that after a development time of 60 s with the same developer from Example 16, the exposed regions had been completely removed. The unexposed regions were also almost completely removed. At 860 nm/min, the removal of the unexposed regions (dark removal) was in the same order of magnitude as the removal rate for the exposed regions (2,360 nm/min). At 2.7, the solubility ratio (solubility in the exposed region/solubility in the unexposed region) was too low to produce vertical edges It was only possible to produce structures, albeit with very flat edges, using a development time of 20 s.

What is claimed is:

1. A positive-working radiation-sensitive mixture comprising in amounts sufficient to form a positive working, radiation sensitive mixture (a) a binder which is insoluble in water and soluble or at least swellable in aqueous alkaline solution, and (b) a photoactive effective amount of a polyfunctional compound comprising α-diazo-β-keto ester units and sulfonate units according to the formula I

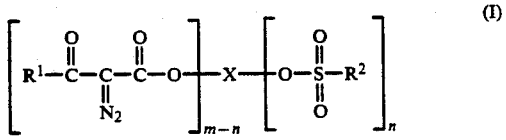

in which
R$^1$ and R$^2$, independently of one another, are an unsubstituted or substituted aliphatic, cycloaliphatic, araliphatic or aromatic radical having 4 to 20 carbon atoms, it being possible for individual CH$_2$ groups to be replaced by oxygen or sulfur atoms or by N or NH groups and/or to contain keto groups,
X is an unsubstituted or substituted aliphatic, cycloaliphatic, carbocyclic, heterocyclic or araliphatic radical having 2 to 22 carbon atoms, it being possible for individual CH$_2$ groups to be replaced by oxygen or sulfur atoms or by the groups —NR$^3$—, —C(O)—O—, —C(O)—NR$^3$—, —C(O)—N—, —NR$^3$—C(O)—NR$^4$—,

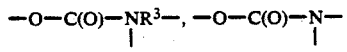

or —O—C(O)—O—, or CH groups to be replaced by

in which Ser. No. 07/694,353
R$^3$ and R$^4$, independently of one another, are hydrogen or an unsubstituted or substituted aliphatic, carbocyclic or araliphatic radical,
m is an integer from 3 to 8,
n is an integer from 1 to 3, and m>n.

2. A positive-working radiation-sensitive mixture as claimed in claim 1, wherein R$_3$ and R$^4$ are independently hydrogen or unsubstituted or substituted (C$_1$-C$_3$)alkyl, (C$_6$-C$_{12}$)aryl or (C$_6$-C$_{11}$)aralkyl.

3. A positive-working radiation-sensitive mixture as claimed in claim 2, wherein R$^3$ and R$^4$ are independently hydrogen or (C$_1$-C$_3$)alkyl.

4. A positive-working radiation-sensitive mixture as claimed in claim 2, wherein R$^3$ and R$^4$ are independently (C$_6$-C$_{12}$)aryl or (C$_6$-C$_{11}$)aralkyl which are unsubstituted or substituted on the rings thereof by (C$_1$-C$_3$)alkyl, (C$_1$-CV$_3$)alkoxy, halogen or amino.

5. A positive-working radiation-sensitive mixture as claimed in claim 4, wherein said halogen is chlorine or bromine.

6. A positive-working radiation-sensitive mixture as claimed in claim 1, wherein at least one of R$^1$, R$^2$ and X is substituted by (C$_1$-C$_3$)alkyl, (C$_1$-C$_3$)alkoxy, halogen, amino or nitrile.

7. A positive-working radiation-sensitive mixture as claimed in claim 6, wherein at least one of R$^1$, R$^2$ and X is substituted by (C$_1$-C$_3$)alkyl or (C$_1$-C$_3$)alkoxy.

8. A positive-working radiation-sensitive mixture as claimed in claim 1, wherein at least one of R$^1$ and R$^2$ is a substituted aliphatic radical having 4 to 10 chain members.

9. A positive-working radiation-sensitive mixture as claimed in claim 8, wherein R$^1$ is a substituted aliphatic radical having 4 to 10 chain members.

10. A positive-working radiation-sensitive mixture as claimed in claim 8, wherein in at least one of R$^1$ and up to 3 CH$_2$ groups are independently replaced by oxygen atoms, —NH— groups or keto groups.

11. A positive-working radiation-sensitive mixture as claimed in claim 10, wherein R$^1$ is an aliphatic radical in which up to two CH$_2$ groups are replaced by oxygen atoms.

12. A positive-working radiation-sensitive mixture as claimed in claim 1, wherein R$^1$ is an unsubstituted aliphatic radical containing up to 20 chain members.

13. A positive-working radiation-sensitive mixture as claimed in claim 12, wherein R$^1$ is a t-butyl radical.

14. A positive-working radiation-sensitive mixture as claimed in claim 1, wherein at least one of R$^1$ and R$^2$ is an unsubstituted or substituted cycloaliphatic radical having 4, 5, 6 or 12 ring members.

15. A positive-working radiation-sensitive mixture as claimed in claim 14, wherein said cycloaliphatic radical has 4, 5 or 6 ring members.

16. A positive-working radiation-sensitive mixture as claimed in claim 15, wherein said cycloaliphatic radical has 6 ring members.

17. A positive-working radiation-sensitive mixture as claimed in claim 14, wherein said cycloaliphatic radical is unsubstituted.

18. A positive-working radiation-sensitive mixture as claimed in claim 1, wherein at least one of R$^1$ and R$^2$ is an araliphatic radical having 2 to 11 chain members in the aliphatic moiety of said radical.

19. A positive-working radiation-sensitive mixture as claimed in claim 18, wherein said araliphatic radical has 2 to 5 chain members in the aliphatic moiety of said radical.

20. A positive-working radiation-sensitive mixture as claimed in claim 18, wherein said aliphatic moiety is a pure carbon chain having 1 or 2 chain members.

21. A positive-working radiation-sensitive mixture as claimed in claim 18, wherein in said aliphatic moiety up to 3 CH$_2$ groups are replaced by heteroatoms, with the proviso that at least one chain member is a carbon.

22. A positive-working radiation-sensitive mixture as claimed in claim 21, wherein in the aliphatic moiety of radical R$^1$ up to 2 CH$_2$ groups are replaced by heteroatoms and wherein said aliphatic moiety contains 3 to 5 chain members 23. A positive-working radiation-sensitive mixture as claimed in claim 18, wherein R² is an unsubstituted aliphatic radical containing 1 to 8 chain members.

24. A positive-working radiation-sensitive mixture as claimed in claim 1, wherein R² is an unsubstituted or substituted carbocyclic or heterocyclic aromatic radical.

25. A positive-working radiation-sensitive mixture as claimed in claim 24, wherein R² contains 6 to 12 carbon atoms.

26. A positive-working radiation-sensitive mixture as claimed in claim 25, wherein R² is a phenyl group.

27. A positive-working radiation-sensitive mixture as claimed in claim 24, wherein R² is substituted with an alkyl, alkoxy, halogen, nitrile, nitro, amino or amido group.

28. A positive-working radiation-sensitive mixture as claimed in claim 1, wherein in X a maximum of 5 CH₂ groups are replaced by said heteroatoms or groups.

29. A positive-working radiation-sensitive mixture as claimed in claim 28, wherein in X a maximum of 3 CH₂ groups are replaced by said heteroatoms or groups.

30. A positive-working radiation-sensitive mixture as claimed in claim wherein X is aliphatic and unsubstituted and has a maximum of 6 carbon atoms.

31. A positive-working radiation-sensitive mixture as claimed in claim 30, wherein X contains a maximum of one C—C multiple bond.

32. A positive-working radiation-sensitive mixture as claimed in claim 31, wherein X has 4 chain members.

33. A positive-working radiation-sensitive mixture as claimed in claim 31, wherein X is trivalent.

34. A positive-working radiation-sensitive mixture as claimed in claim 28, wherein said CH₂ groups are replaced by heteroatoms of one type.

35. A positive-working radiation-sensitive mixture as claimed in claim 28, wherein a CH group has been replaced by

and no further substitution is present in the radical X.

36. A positive-working radiation-sensitive mixture as claimed in claim 28, wherein X is a cycloaliphatic radical in which the cycloaliphatic moiety is unsubstituted and is adjacent to a CH₂ group of an aliphatic moiety which is substituted by at least one said heteroatom or group.

37. A positive-working radiation-sensitive mixture as claimed in claim 36, wherein said cycloaliphatic moiety is directly adjacent to a nitrogen atom.

38. A positive-working radiation-sensitive mixture as claimed in claim 37, wherein said cycloaliphatic moiety is directly adjacent to a nitrogen atom of the group

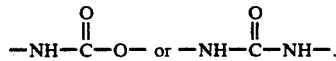

39. A positive-working radiation-sensitive mixture as claimed in claim 36, wherein said cycloaliphatic moiety is linked to the oxygen atom of a

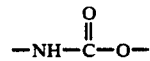

radical via an ethylene group

40. A positive-working radiation-sensitive mixture as claimed in claim 12, wherein X is an araliphatic radical in which the aromatic moiety thereof is linked to the aliphatic moiety thereof via a heteroatom.

41. A positive-working radiation-sensitive mixture as claimed in claim 40, wherein said aromatic moiety is a phenyl or phenylene radical.

42. A positive-working radiation-sensitive mixture as claimed in claim 1, wherein m is an integer from 3 to 6, and n is 1 or 2.

43. A positive-working radiation-sensitive mixture as claimed in claim 1, comprising at least two α-diazo-β-keto esters of the formula I.

44. A positive-working radiation-sensitive mixture as claimed in claim 43, comprising two α-diazo-β-keto esters of the formula I.

45. A positive-working radiation-sensitive mixture as claimed in claim 1, comprising about 4 to 40 wt% of said photoactive component.

46. A positive-working radiation-sensitive mixture as claimed in claim 45, comprising about 6 to 36 wt% of said photoactive component.

47. A positive-working radiation-sensitive mixture as claimed in claim 1, wherein said binder has a low inherent absorption in the wavelength range from about 190 to 300 nm.

48. A positive-working radiation-sensitive mixture as claimed in claim 1, wherein said binder comprises about 0 to 30 wt% of a novolak condensation resin, based on the weight of the binder.

49. A positive-working radiation-sensitive mixture as claimed in claim 48, wherein said binder comprises about 0 to 20 wt% of a novolak condensation resin.

50. A positive-working radiation-sensitive mixture as claimed in claim 1, said binder contains phenolic hydroxyl groups.

51. A positive-working radiation-sensitive mixture as claimed in claim 1, wherein said binder is present in an amount ranging from about 60 to 96 wt%, based on the total weight of the mixture.

52. A positive-working radiation-sensitive mixture as claimed in claim 51, wherein said binder is present in an amount ranging from about 65 to 94 wt%, based on the total weight of the mixture.

53. A positive-working radiation-sensitive mixture as claimed in claim 1, which contains no or substantially no novolak resin.

54. A positive-working radiation-sensitive mixture as claimed in claim 1, wherein said binder is a homopolymer or copolymer of unsubstituted or alkyl-substituted p-hydroxystyrene.

55. A positive-working radiation-sensitive mixture as claimed in claim 54, wherein said binder is poly(3-methyl-4-hydroxystyrene).

56. A positive-working radiation-sensitive mixture as claimed in claim 1, wherein said binder is poly(styrene-co-maleimide).

57. A positive-working radiation-sensitive mixture as claimed in claim 1, wherein m-n≧2.

58. A positive-working radiation-sensitive mixture as claimed in claim 1, wherein m-n≧3.

59. A positive-working recording material comprising a base and a positive-working mixture applied thereto, wherein said positive-working mixture is a mixture as claimed in claim 1.

* * * * *

UNITED STATES PATENT AND TRADEMARK OFFICE
CERTIFICATE OF CORRECTION

PATENT NO. : 5,256,517
DATED : October 26, 1993
INVENTOR(S) : Horst ROESCHERT, Georg PAWLOWSKI, Hans-Joachim MERREM Ralph DAMMEL and Walter SPIESS It is certified that error appears in the above-indentified patent and that said Letters Patent is hereby corrected as shown below:

Column 25, line 53, delete "Ser. No. 07/694,353" after "in which".

Column 26, line 2, "$(C_1-CV_3)$" should read --$(C_1-C_3)$--.

Column 26, line 22, insert --$R^2$-- after "$R^1$ and".

Signed and Sealed this

Third Day of May, 1994

Attest:

BRUCE LEHMAN

Attesting Officer

Commissioner of Patents and Trademarks